United States Patent

Sumiyoshi et al.

[11] Patent Number: 6,014,455
[45] Date of Patent: *Jan. 11, 2000

[54] PROJECTION EXPOSURE APPARATUS AND DEVICE MANUFACTURING METHOD

[75] Inventors: Yuhei Sumiyoshi; Koji Mikami, both of Utsunomiya, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/579,583

[22] Filed: Dec. 28, 1995

[30] Foreign Application Priority Data

Dec. 29, 1994 [JP] Japan .................................. 6-340070
Dec. 25, 1995 [JP] Japan .................................. 7-350915

[51] Int. Cl.⁷ .................................................. G03B 27/42
[52] U.S. Cl. ........................... 382/144; 382/255; 353/69; 250/201.2; 438/7; 438/16; 359/754
[58] Field of Search ..................................... 382/144, 151, 382/100, 255, 141, 145, 149; 353/69, 97, 28; 355/53, 52, 76, 68; 250/201.2; 438/5–9, 14, 16; 359/754

[56] References Cited

U.S. PATENT DOCUMENTS

| | | | |
|---|---|---|---|
| 4,637,690 | 1/1987 | Miyamae et al. | 350/427 |
| 4,669,842 | 6/1987 | Yomoda et al. | 353/101 |
| 4,699,505 | 10/1987 | Komoriya et al. | 355/30 |
| 4,725,722 | 2/1988 | Maeda et al. | 250/201 |
| 4,786,947 | 11/1988 | Kosugi et al. | 355/30 |
| 4,825,247 | 4/1989 | Kemi et al. | 355/55 |
| 4,907,021 | 3/1990 | Yabu | 353/101 |
| 5,105,075 | 4/1992 | Ohta et al. | 250/201.2 |
| 5,117,255 | 5/1992 | Shiraishi et al. | 355/53 |
| 5,436,692 | 7/1995 | Noguchi | 355/53 |
| 5,581,324 | 12/1996 | Miyai et al. | 355/53 |
| 5,633,101 | 5/1997 | Imai | 430/5 |
| 5,721,608 | 2/1998 | Taniguchi | 355/53 |

FOREIGN PATENT DOCUMENTS

| | | |
|---|---|---|
| 60-261137 | 12/1985 | Japan . |
| 4-30411 | 2/1992 | Japan . |
| 4-30412 | 2/1992 | Japan . |
| 5-41004 | 2/1993 | Japan . |

*Primary Examiner*—Leo H. Boudreau
*Assistant Examiner*—Brian P. Werner
*Attorney, Agent, or Firm*—Fitzpatrick, Cella, Harper & Scinto

[57] ABSTRACT

A projection exposure apparatus usable with a reticle having a pattern and a wafer onto which the pattern of the reticle is transferred. The apparatus includes an illumination system for illuminating the reticle, a projection optical system for projecting the pattern of the reticle onto the wafer, wherein the projection optical system includes two lens groups which are individually movable along an optical axis direction, but are not juxtaposed with each other, and a controller for simultaneously adjusting distortion and projection magnification of the pattern projected onto the wafer. The controller performs the adjustment such that the two lens groups of the projection optical system are moved separately along the optical axis direction.

13 Claims, 4 Drawing Sheets

PROJECTION EXPOSURE APPARATUS AND DEVICE MANUFACTURING METHOD

FIELD OF THE INVENTION AND RELATED ART

This invention relates generally to a projection exposure apparatus and a device manufacturing method. More particularly, the invention is concerned with a projection exposure apparatus and a device manufacturing method, suitably applicable to a stepper (device manufacturing apparatus), for example, for satisfactorily correcting a projection magnification error and a distortion error in the projection of an electronic circuit pattern of a reticle upon a wafer through a projection optical system, to thereby produce a high precision projection pattern and to enable the manufacture of devices having a higher degree of integration.

Extraordinarily high assembling precision and optical performance are required in printing apparatuses (aligners) for the manufacture of semiconductor devices such as ICs or LSIs.

Among them, the matching precision in the registration of a reticle, having an electronic circuit pattern formed thereon, with a wafer is particularly important. The size of a pattern of a reticle has become smaller and smaller and, with this size reduction, higher and higher matching precision has been required. The most influential factors to this matching precision are a projection magnification error and a distortion error of a projection optical system.

The projection magnification error is a deviation of the projection magnification (lateral magnification) of a projection optical system from a set value, and the distortion error is a deviation of distortion (distortion aberration) of the projection optical system from a reference value. The projection magnification error and the distortion error each appears as a difference or shift between a desired grid point and a grid point of a projected pattern. Thus, it is desirable to reduce the projection magnification error and the distortion error as much as possible, constantly.

The projection magnification error and distortion error of a projection optical system are corrected through the adjustment in the manufacturing processes of the projection optical system or through the adjustment made when the apparatus is installed. However, after the apparatus is installed, the magnification or distortion is changeable with environmental conditions, particularly, pressure and temperature. Also, a projection optical system absorbs exposure energy during an exposure process of a wafer, and the temperature of the system rises. This causes changes in the optical elements (such as the refractive index, shape, etc.), such that the projection magnification error and distortion error may change.

U.S. Pat. No. 5,105,075 assigned to the same assignee of the subject application discloses a projection exposure apparatus in which both the spacing between a reticle (object plane) and a projection optical system and the lens group spacing in the lens groups, constituting the projection optical system, are changed to correct a projection magnification error and a distortion error.

Japanese Laid-Open Patent Application, Laid-Open No. 4-30411, discloses an aligner in which the wavelength of light projected from a light source is changed by wavelength changing means and, simultaneously therewith, a reticle or a lens group is displaced to thereby correct a projection magnification error and a symmetrical distortion error.

Japanese Laid-Open Patent Application, Laid-Open No. 4-30412, discloses an aligner in which the wavelength of light projected from a light source is changed by wavelength changing means and, simultaneously therewith, the pressure or a gas component between lens groups is adjusted to thereby correct a projection magnification error and a symmetrical distortion error.

SUMMARY OF THE INVENTION

It is an object of the present invention to provide an improved projection exposure apparatus and/or a device manufacturing method, by which a projection magnification error and/or a distortion error of a projection optical system is corrected satisfactorily.

It is another object of the present invention to provide an improved projection optical system with an arrangement by which projection magnification and/or distortion can be adjusted precisely.

In accordance with an aspect of the present invention, there is provided a projection exposure apparatus usable with a reticle having a pattern and a wafer onto which the pattern of the reticle is to be transferred, said apparatus comprising: first holding means for holding the reticle; second holding means for holding the wafer; and a projection optical system for projecting the pattern of the reticle onto the wafer, wherein said projection optical system includes at least two lens groups which are able to be individually displaced along an optical axis to thereby adjust at least one of projection magnification and distortion of the pattern projected or to be projected onto the wafer.

In one preferred form of this aspect of the present invention, the apparatus may further comprise detecting means for detecting at least one of the projection magnification and the distortion.

The detecting means may detect the projection magnification or the distortion on the basis of analysis of an image of the pattern formed on the wafer.

The detecting means may detect the projection magnification or the distortion on the basis of a change in pressure surrounding said projection optical system.

The apparatus may further comprise correcting means for substantially correcting the projection magnification or the distortion in accordance with the detection by said detecting means.

The projection optical system may include more than two lens groups and said at least two lens groups may be those lens groups whose displacement along the optical axis produces less change in optical performance of said projection optical system, other than the projection magnification and the distortion.

The projection optical system may include more than two lens groups and said at least two lens groups may be those lens groups which provide a larger ratio, in absolute value, between the amount of change in image height due to a change in distortion of those lens groups and the amount of change in image height due to a change in projection magnification.

The projection exposure apparatus according to this aspect of the present invention is suitably applicable to the manufacture of microdevices such as semiconductor devices (e.g., ICs or LSIs), display devices (e.g., liquid crystal panels) or image pickup devices (e.g., CCDs).

In accordance with another aspect of the present invention, there is provided a device manufacturing method, comprising the steps of: illuminating a reticle having a pattern; projecting, through a projection optical system, the pattern of the reticle onto a wafer, wherein the projection optical system includes at least two lens groups; and displacing said at least two lens groups of the projection optical system individually along an optical axis to thereby adjust at least one of projection magnification and distortion of the pattern projected or to be projected on the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
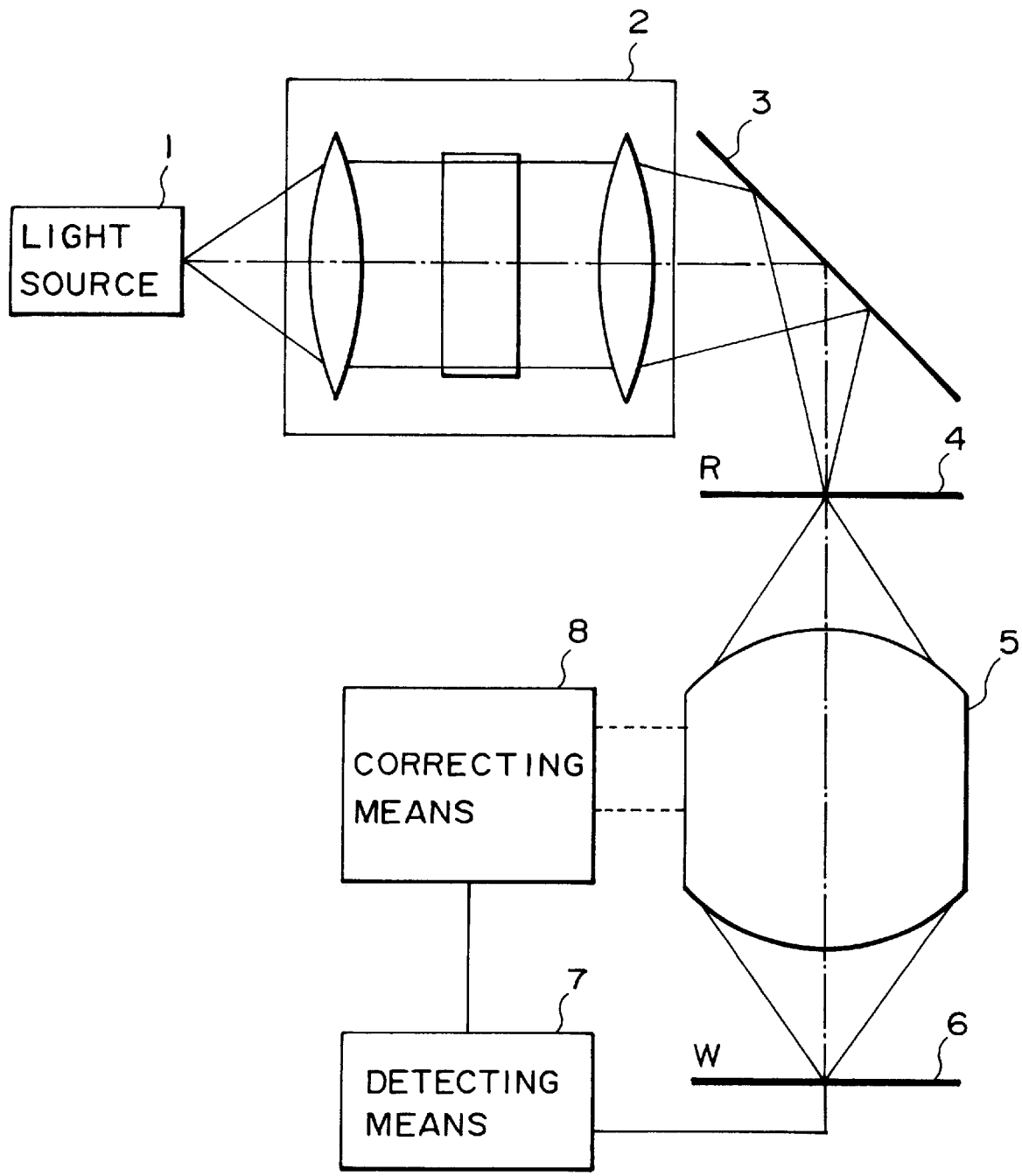
FIG. 1 is a schematic view of a main portion of a projection exposure apparatus according to an embodiment of the present invention.

FIG. 1 is a schematic view of a main portion of a projection exposure apparatus according to an embodiment of the present invention. Denoted in the drawing at 1 is a light source which comprises an ultra-high pressure Hg lamp, for example. Denoted at 2 is an illumination system, which may include a collimator lens, an optical integrator and a condenser lens. The illumination system 2 serves to uniformly illuminate the surface of a reticle 4, through a mirror 3. Also, it serves to provide a uniform illuminance distribution upon the surface of a wafer 6. The mirror 3 reflects the light from the illumination system 2 toward the reticle 4 and a projection optical system 5. The reticle 4 is formed with a fine electronic circuit pattern for the manufacture of ICs or LSIs, for example. The projection optical system 5 functions to project the pattern of the reticle 4 onto the wafer 6 surface with a predetermined reduction magnification.

Denoted at 7 is detecting means for detecting a projection magnification error or a symmetrical distortion error, for example, of the projection optical system 5. As an example, photoelectric converting means comprising a two-dimensional (area) image pickup device may be disposed at the position of the wafer 6, and the state of imaging of an image of a pattern of a test reticle, with a grating-like pattern, may be monitored, to this end. Denoted at 8 is correcting means, which serves to displace predetermined ones (two, for example) of lens groups, constituting the projection optical system 5, along an optical axis of the projection optical system in accordance with an output signal from the detecting means 7, corresponding to the detected error.

In this embodiment, with the structure described above, the positions of appropriate two lens groups, of the lens groups of the projection optical system, with respect to the optical axis may be shifted to adjust the projection magnification and distortion of the projection optical system while avoiding deterioration of other aberrations. Particularly, the projection magnification error and distortion error of the projection optical system can be corrected satisfactorily.

The correcting means 8 of this embodiment comprises lens driving means. As regards this lens driving means, for example, a method in which a movable barrel for holding lens groups is guided by an air bearing guide and is moved in the optical axis direction by means of pressure from a driving pressure source, or a method in which a suitable voltage is applied to a piezoelectric device to thereby move a movable lens barrel, is applicable.

In this embodiment, the detecting means 7 performs image processing to an image of a pattern of a test reticle and, based on the analysis of the pattern image, it determines the projection magnification error and distortion error. As an alternative, any change in ambience temperature, pressure or humidity, for example, of the projection optical system may be detected by a sensor and, on the basis of the relationship between the change in environmental condition and the projection magnification or distortion, which relationship may be detected beforehand through experiments, for example, the projection magnification error or distortion error may be determined. As a further alternative, an actually printed pattern may be analyzed by means of an electron microscope, for example, to determine the projection magnification error or distortion error. It is a possible alternative that the projection magnification error or distortion error is determined on the basis of the exposure time (continuous operation time of a projection exposure apparatus). These methods may be used in combination.

Figure 2:
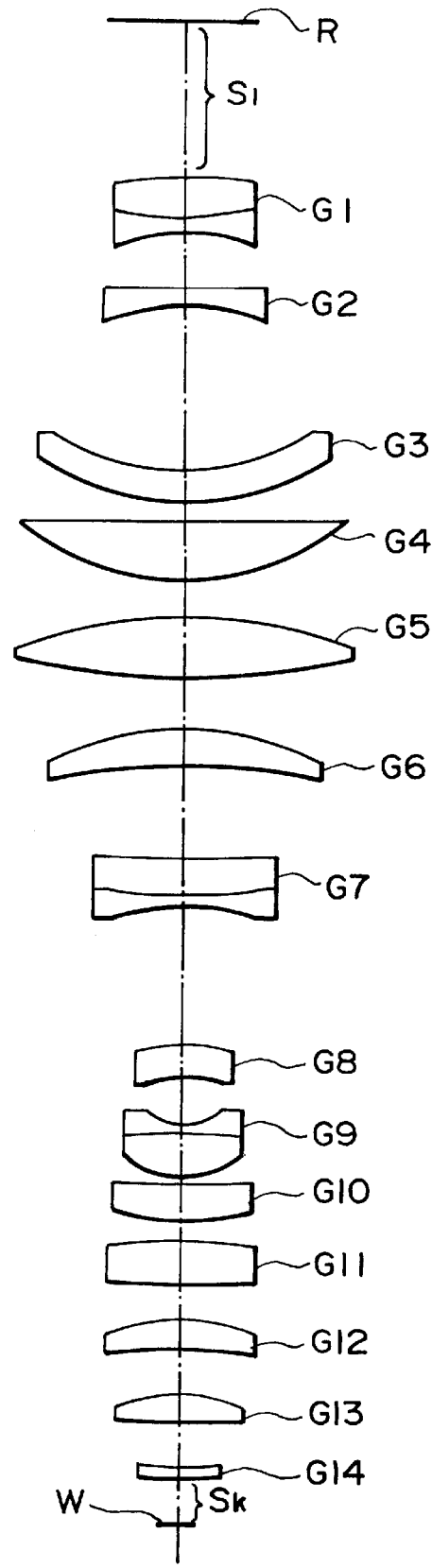
FIG. 2 is a schematic and sectional view of a projection optical system of the FIG. 1 embodiment.

FIG. 2 is a sectional view of the lens system of the projection optical system according to an embodiment of the present invention. In this embodiment, aberration is corrected with respect to exposure light of i-line (wavelength 365 nm)

In the drawing, denoted at R is a reticle having an electronic circuit pattern formed thereon. Denoted at G1–G14 are lens groups constituting the projection optical system. Denoted at W is a wafer which is disposed at the best image plane. Reference character $S_1$ denotes the distance between the reticle R and the first lens surface of the projection optical system, and reference character $S_k$ denotes the distance between the last lens surface of the projection optical system and the wafer W.

Table 1 below shows numerical data of the projection optical system of this embodiment. In this numerical data, Ri is the curvature radius (mm) of the i-th lens surface, in order from the object side. Di is the spacing (mm) between the i-th lens surface and the (i+1)-th lens surface, in order from the object side. Ni is the refractive index of the medium between the i-th lens surface and the (i+1)-th lens surface, in order from the object side.

TABLE 1

Numerical Data of Projection Optical System

|  | Ri | Di | Ni |
| --- | --- | --- | --- |
| G1 | 318.34 | 19.974 | 1.50415 |
|  | −162.09 | 6.838 | 1.60250 |
|  | 101.35 | 28.045 | 1. |
| G2 | 1508.74 | 9..975 | 1.60250 |
|  | 123.26 | 83.558 | 1. |
| G3 | −141.44 | 19.381 | 1.56226 |
|  | −138.64 | 8.110 | 1. |
| G4 | 22976.42 | 30.008 | 1.50415 |
|  | −138.77 | 20.563 | 1. |
| G5 | 288.07 | 29.988 | 1.53639 |
|  | −393.00 | 26.168 | 1. |
| G6 | 159.92 | 18.692 | 1.56226 |
|  | 338.59 | 47.986 | 1. |
| G7 | −810.79 | 19.292 | 1.53639 |
|  | −291.06 | 5.595 | 1.60250 |

TABLE 1-continued

Numerical Data of Projection Optical System

|     | Ri       | Di     | Ni      |
|-----|----------|--------|---------|
|     | 127.57   | 69.800 | 1.      |
| G8  | 99.22    | 16.839 | 1.62753 |
|     | 59.01    | 24.957 | 1.      |
| G9  | −33.50   | 4.695  | 1.50250 |
|     | 706.69   | 22.778 | 1.50415 |
|     | −48.18   | 2.512  | 1.      |
| G10 | −1279.64 | 19.963 | 1.50415 |
|     | −147.63  | 9.506  | 1.      |
| G11 | 302.93   | 23.069 | 1.53639 |
|     | −534.55  | 17.457 | 1.      |
| G12 | 100.36   | 16.014 | 1.56226 |
|     | 290.71   | 21.835 | 1.      |
| G13 | 82.88    | 16.021 | 1.56226 |
|     | −928.73  | 22.440 | 1.      |
| G14 | −191.94  | 6.231  | 1.62753 |
|     | −579.28  |        | 1.      |

$S_1 = 75$ mm, $S_k = 24.251$ mm

Table 2 below shows changes in the projection optical system as having the lens data of Table 1 when the lens groups G1–G14 are individually displaced along the optical axis by 1 mm: more specifically, the amount of change in spherical aberration, at $\delta SA$; the amount of change in coma, at $\delta CM$; the amount of change in astigmatism, at $\delta As$; the amount of change in image height due to a change in distortion aberration, at $\delta D$; the amount of change in image height due to a change in projection magnification, at $\delta \beta$; and the ratio of $\delta D$ and $\delta \beta$, at $\delta D/\delta \beta$. Here, the amounts of changes in coma, astigmatism and distortion are taken at the position of an image height of 10 mm upon the wafer surface.

TABLE 2

Changes in Aberrations with Movement of Lens Groups

|     | $\delta D$ ($\mu$m) | $\delta \beta$ ($\mu$m) | $\delta SA$ ($10^{-3} \lambda$) | $\delta CM$ ($10^{-3} \lambda$) | $\delta As$ ($\mu$m) | $\|\delta D/\delta \beta\|$ |
|-----|--------|---------|-------|-------|--------|------|
| G1  | −11.45 | 36.14   | 0.02  | −0.86 | 14.73  | 0.32 |
| G2  | −53.39 | 70.97   | 0.41  | −5.30 | 73.78  | 0.75 |
| G3  | 11.78  | −16.16  | 0.00  | 0.67  | −12.48 | 0.73 |
| G4  | 55.78  | −67.11  | −0.35 | 5.12  | −76.87 | 0.83 |
| G5  | −11.89 | 50.95   | 0.15  | −1.20 | 11.39  | 0.23 |
| G6  | −0.09  | 70.02   | 0.03  | −0.58 | −5.61  | 0.00 |
| G7  | 10.45  | −108.18 | −0.17 | 1.43  | −5.46  | 0.10 |
| G8  | −1.57  | −35.86  | 0.36  | 1.60  | 9.97   | 0.04 |
| G9  | 2.52   | −4.78   | 0.52  | −0.25 | −15.85 | 0.53 |
| G10 | 1.33   | 33.79   | −0.94 | −0.14 | 4.61   | 0.04 |
| G11 | −0.87  | 21.69   | −0.55 | −0.32 | −0.62  | 0.04 |
| G12 | −2.18  | 8.92    | −0.29 | 0.12  | 2.26   | 0.24 |
| G13 | 2.76   | −57.77  | 2.22  | 1.02  | 7.63   | 0.05 |
| G14 | −1.02  | 23.23   | −1.24 | −1.59 | −7.31  | 0.04 |

In order to correct projection magnification error or distortion error while suppressing deterioration of aberrations, other than the projection magnification error and distortion error, as much as possible, it is desirable to select those lens groups which produce less change in $\delta SA$, $\delta CM$ and $\delta As$ to a change in $\delta D$ or $\delta \beta$. To assure this, from the numerical values of Table 2, the following quantities may be calculated and those lens groups with which these quantities all become small may be selected as the lens groups to be moved for the correction of projection magnification error and distortion error:

$$\frac{\delta SA}{\delta D}, \frac{\delta SA}{\delta \beta}, \frac{\delta CM}{\delta D}, \frac{\delta CM}{\delta \beta}, \frac{\delta As}{\delta D}, \frac{\delta As}{\delta \beta}$$

Also, in order to suppress deterioration of aberrations other than the projection magnification error and distortion error, the amount of movement of the two lens groups to be moved for the correction should desirably be small. To assure this, a combination of those two lens groups which provides a larger difference in absolute values of $|\delta D/\delta \beta|$ may be selected as the two lens groups to be moved.

Further, a group which shows so sensitive a response to movement with respect to the projection magnification error or distortion error, is not preferable because of a difficulty of control. Namely, a lens group having a too large value in $\delta D$ or $\delta \beta$ should not be moved.

From the reasons described above, in this embodiment, the lens groups G1 and G3 are selected and, by adjusting these lens groups, the projection magnification error and distortion error are corrected satisfactorily.

If the movement amount of the lens group G1 is $\delta G1$ and the movement amount of the lens group G3 is $\delta G3$, from the data of Table 2, the amount of change in image height ($\delta D$) due to a change in distortion and the amount of change in image height ($\delta \beta$) due to a change in projection magnification are expressed by the following equations:

$$\left.\begin{array}{l} \delta D = -11.45\delta G1 + 11.78\delta G3 \\ \delta B = 36.14\delta G1 - 16.16\delta G3 \end{array}\right\} \quad (1)$$

Thus, once correction target values for the distortion aberration and projection magnification are given, $\delta G1$ and $\delta G3$ can be given by the following equations:

$$\left.\begin{array}{l} \delta G1 = k(16.16\delta D + 11.78\delta \beta) \\ \delta G2 = k(36.14\delta D + 11.45\delta \beta) \end{array}\right\} \quad (2)$$

where $k = (240.70)^{-1}$ where $k = (240.70)^{-1}$

On the basis of these values, in this embodiment, both the projection magnification error and the distortion error, which are, as compared with the other errors, most influenced by a change in environmental conditions such as pressure, temperature, humidity and the like, are corrected satisfactorily.

Particularly, in a determination of the lens groups to be moved, those lens groups which show less change in aberrations other than symmetrical distortion may be selected and, by doing so, the optical performance even in the other respects can be kept satisfactory before and after the correction.

On an occasion when a projection magnification error is caused due to elongation or contraction of a wafer, in the projection optical system of this embodiment, it is possible to correct only such a projection magnification error while maintaining distortion constant. To this end, for example, a lens group (e.g., lens group G3) may be moved so as to cancel a change in distortion which results from correction movement of a lens group (e.g., lens group G1). Similarly, it is possible in the projection optical system of this embodiment to correct distortion only, while maintaining the projection magnification.

While two lens groups are moved in this embodiment, three or more lens groups may of course be moved.

Next, an embodiment of a device manufacturing method which uses a projection exposure apparatus having been described hereinbefore, will be explained. In this embodiment, the invention is applied to the manufacture of semiconductor devices.

Figure 3:
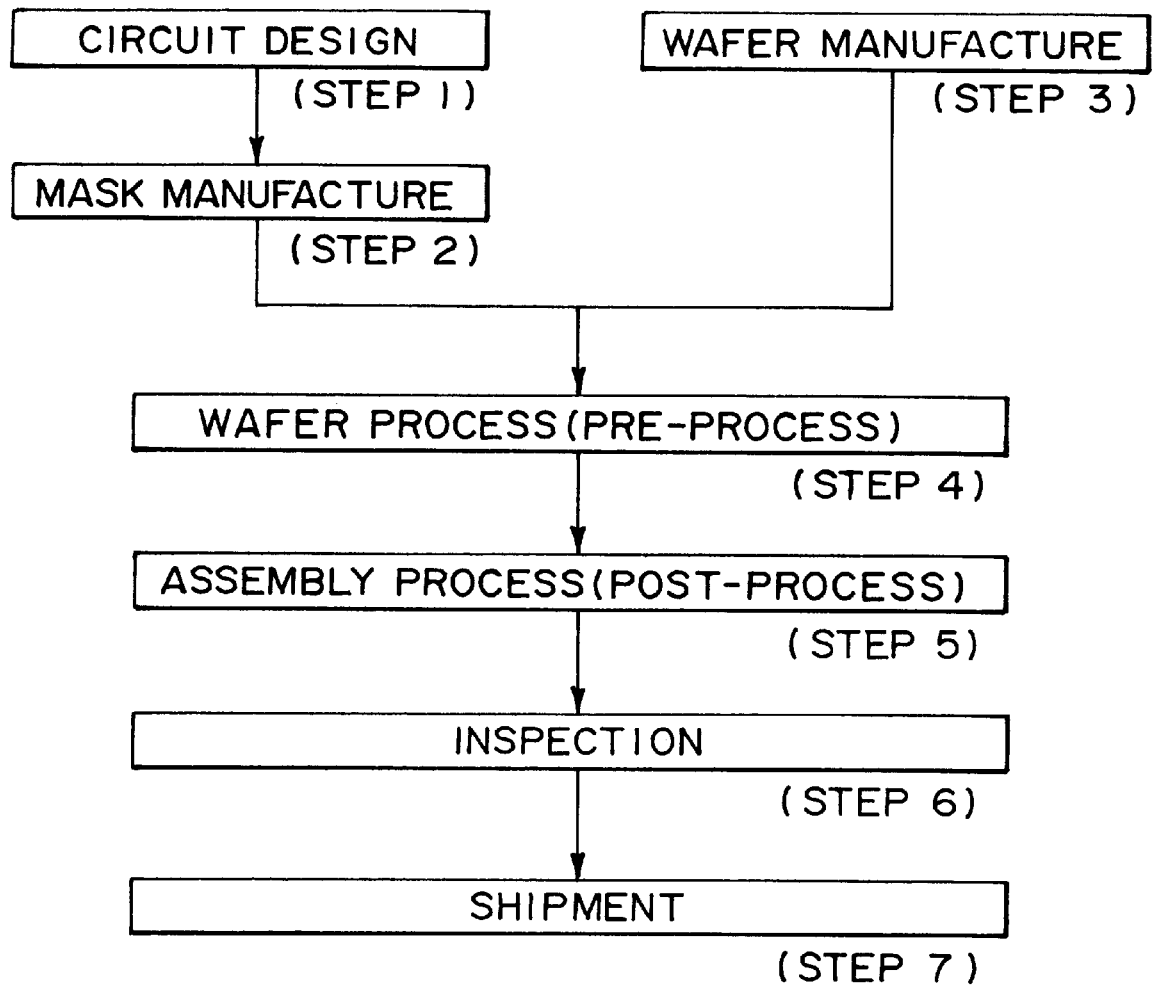
FIG. 3 is a flow chart of device manufacturing processes according to an embodiment of the present invention.

FIG. 3 is a flow chart of the sequence of manufacturing semiconductor devices such as semiconductor chips (e.g., ICs or LSIs), liquid crystal panels or CCDs, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 4:
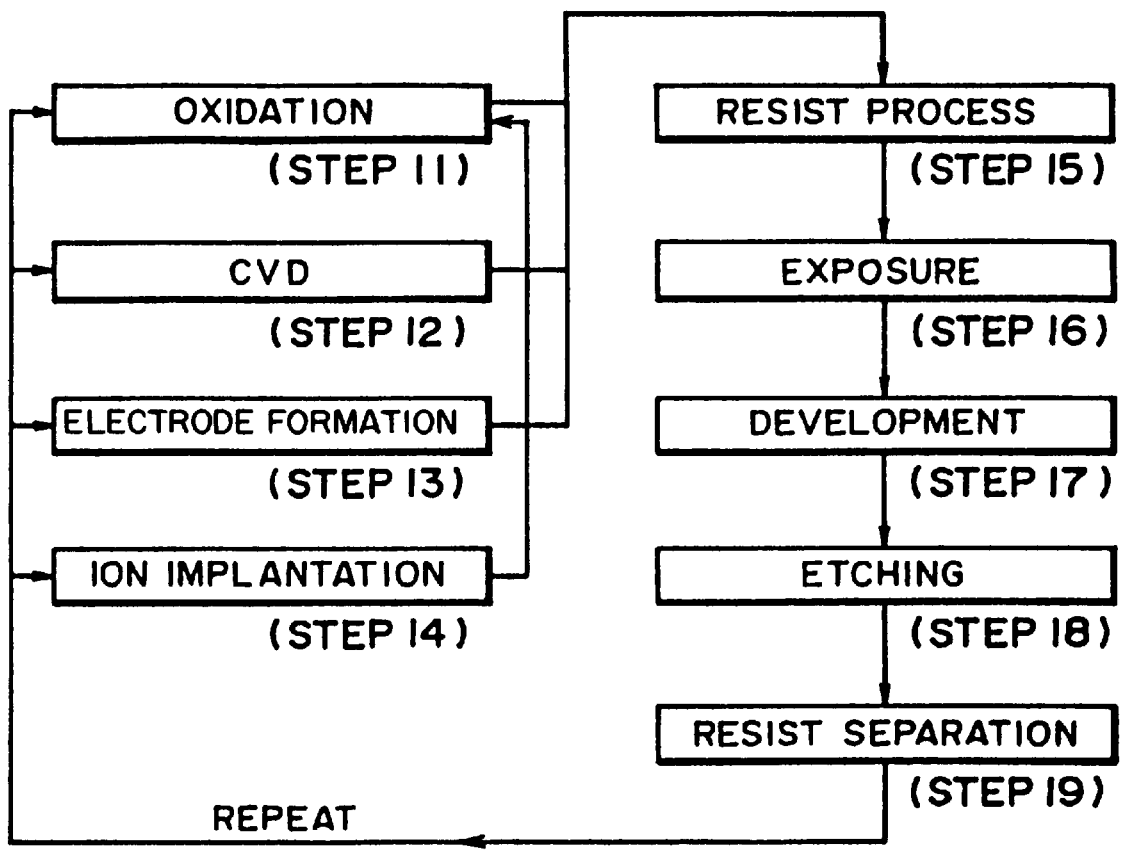
FIG. 4 is a flow chart for explaining details of a wafer process in the sequence of FIG. 3.

FIG. 4 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus usable with a reticle having a pattern and a wafer onto which the pattern of the reticle is transferred, said apparatus comprising:

an illumination system for illuminating the reticle;

a projection optical system for projecting the pattern of the reticle onto the wafer, wherein said projection optical system comprises two lens units, which are individually movable along an optical axis direction, but are not juxtaposed with each other, the two lens units being selected out of the lens units constituting the projection optical system, excluding a lens unit that shows a largest amount of change in image height with a change in distortion caused as the lens units are moved along the optical axis direction and excluding a lens unit that shows a largest amount of change in image height with a change in projection magnification; and control means for simultaneously adjusting distortion and projection magnification of the pattern projected onto the wafer, said control means performing the adjustment such that said two lens units of said projection optical system are moved separately along the optical axis direction.

2. An apparatus according to claim 1, further comprising detecting means for detecting the projection magnification and the distortion.

3. An apparatus according to claim 2, wherein said detecting means detects the projection magnification and the distortion on the basis of analysis of an image of the pattern formed on the wafer.

4. An apparatus according to claim 2, wherein said detecting means detects the projection magnification and the distortion on the basis of a change in pressure surrounding said projection optical system.

5. An apparatus according to claim 2, further comprising correcting means for substantially correcting the projection magnification and the distortion in accordance with the detection by said detecting means.

6. An apparatus according to claim 1, wherein said two lens units are selected such that their displacement along the optical axis produces less change in aberrations of said projection optical system, relative to changes in projection magnification and distortion, than other lens units.

7. A device manufacturing method, comprising the steps of:

illuminating a reticle having a pattern;

projecting the pattern of the reticle onto a wafer, through a projection optical system that includes two lens units, which are individually movable along an optical axis direction, but are not juxtaposed with each other, the two lens units being selected out of the lens units constituting the projection optical system, excluding a lens unit that shows a largest amount of change in image height with a change in distortion caused as the lens units are moved along the optical axis direction and excluding a lens unit that shows a largest amount of change in image height with a change in projection magnification; and simultaneously adjusting distortion and projection magnification of the pattern projected onto the wafer, wherein, for the adjustment, the two lens units are moved separately along the optical axis direction.

8. A method according to claim 7, further comprising detecting the projection magnification and the distortion.

9. A method according to claim 8, wherein the projection magnification and the distortion are detected on the basis of analysis of an image of the pattern formed on the wafer.

10. A method according to claim 8, wherein the projection magnification and the distortion are detected on the basis of a change in pressure surrounding said projection optical system.

11. A method according to claim 8, further comprising substantially correcting the projection magnification and the distortion in accordance with the detection in said detecting step.

12. A method according to claim 7, wherein the two lens units are selected such that their displacement along the optical axis produces less change in aberrations of the projection optical system, relative to changes in projection magnification and distortion, than other lens units.

13. A projection exposure apparatus usable with a reticle having a pattern and a wafer onto which the pattern of the reticle is transferred, said apparatus comprising:

an illumination system for illuminating the reticle;

a projection optical system for projecting the pattern of the reticle onto the wafer, wherein said projection optical system comprises two lens units, which are individually movable along an optical axis direction but are not juxtaposed with each other; and control means for simultaneously adjusting distortion and projection magnification, said control means performing the adjustment such that said two lens units of said projection optical system are moved separately along the optical axis direction, wherein the two lens units are selected out of the lens units constituting the projection optical system, excluding a lens unit that shows a largest amount of change in image height with a change in the distortion and projection magnification caused as the lens units are moved along the optical axis direction.

* * * * *

UNITED STATES PATENT AND TRADEMARK OFFICE
CERTIFICATE OF CORRECTION

PATENT NO. : 6,014,455
DATED      : January 11, 2000
INVENTOR(S): YUHEI SUMIYOSHI, ET AL.

It is certified that error appears in the above-identified patent and that said Letters Patent is hereby corrected as shown below:

COLUMN 4:

Line 58, Table 1 "9..975" should read --9.975--.

Signed and Sealed this

Sixth Day of March, 2001

Attest:

NICHOLAS P. GODICI

Attesting Officer     Acting Director of the United States Patent and Trademark Office